(12) United States Patent
Kobayashi et al.

(10) Patent No.: US 11,099,245 B2
(45) Date of Patent: Aug. 24, 2021

(54) CELL FOR OPTICALLY PUMPED MAGNETIC SENSOR

(71) Applicants: HAMAMATSU PHOTONICS K.K., Hamamatsu (JP); Kyoto University, Kyoto (JP)

(72) Inventors: Tetsuo Kobayashi, Kyoto (JP); Norihisa Kato, Hamamatsu (JP); Motohiro Suyama, Hamamatsu (JP)

(73) Assignees: HAMAMATSU PHOTONICS K.K., Hamamatsu (JP); Kyoto University, Kyoto (JP)

( * ) Notice: Subject to any disclaimer, the term of this patent is extended or adjusted under 35 U.S.C. 154(b) by 188 days.

(21) Appl. No.: 16/547,772

(22) Filed: Aug. 22, 2019

(65) Prior Publication Data

US 2020/0064421 A1 Feb. 27, 2020

(30) Foreign Application Priority Data

Aug. 24, 2018 (JP) .............................. JP2018-157010

(51) Int. Cl.
*G01R 33/26* (2006.01)
*G01R 33/032* (2006.01)
*G01N 24/00* (2006.01)
*H01S 3/091* (2006.01)

(52) U.S. Cl.
CPC ........... *G01R 33/26* (2013.01); *G01N 24/006* (2013.01); *G01R 33/032* (2013.01); *G01R 33/0322* (2013.01); *H01S 3/091* (2013.01)

(58) Field of Classification Search
CPC .. G01R 33/26; G01R 33/0322; G01R 33/032; G01N 24/006; H01S 3/091
See application file for complete search history.

(56) References Cited

U.S. PATENT DOCUMENTS

2017/0023653 A1*   1/2017   Kobayashi ............. G01R 33/26

FOREIGN PATENT DOCUMENTS

JP             2009-236598 A        10/2009

* cited by examiner

*Primary Examiner* — Susan S Lee
(74) *Attorney, Agent, or Firm* — Faegre Drinker Biddle & Reath LLP (57) ABSTRACT

A cell for a optically pumped magnetic sensor measures magnetic field by setting alkali metal atoms to a predetermined excitation state by a pump beam and detecting the excitation state by a probe beam. The cell is provided with a glass substrate which seals the alkali metal atoms and an enclosing gas and transmits the pump beam and the probe beam and a coating layer provided on an inner surface of the glass substrate. The coating layer is made of an inorganic material.

4 Claims, 9 Drawing Sheets

| ALKALI METAL | D1 TRANSITION WAVELENGTH | D2 TRANSITION WAVELENGTH | HEATING TEMPERATURE |
|---|---|---|---|
| LITHIUM (Li) | 670.98 | 670.96 | 200°C OR HIGHER |
| SODIUM (Na) | 589.6 | 589 | 200°C OR HIGHER |
| POTASSIUM (K) | 770.1 | 767 | 180°C OR HIGHER |
| RUBIDIUM (Rb) | 795 | 780 | 150°C OR HIGHER |
| CESIUM (Cs) | 852 | 895 | 80°C OR HIGHER |

Fig.9

CELL FOR OPTICALLY PUMPED MAGNETIC SENSOR

TECHNICAL FIELD

One aspect of the present invention relates to a cell for a optically pumped magnetic sensor.

BACKGROUND

Optically pumped magnetic sensors (magnetometers) measure tiny magnetic field. The optically pumped magnetometers have attracted attention as a new magnetic sensing technology to be substituted for superconducting quantum interference devices (SQUIDs). For example, Japanese Unexamined Patent Publication No. 2009-236598 discloses a magnetic sensor using optical pumping. The magnetic sensor adopts a configuration of a so-called polarimeter-type detector.

Alkali metal vapors which are vapor-like alkali metal atoms produce spin polarization by optical pumping. The spin polarization of alkali metal vapor is affected by magnetic field. As a result, since the spin polarization is rotated based on a torque from the magnetic field, the rotation angle reflecting the direction of the spin polarization is changed. The optically pumped magnetic sensor utilizes a phenomenon in which the rotation angle of the spin polarization is changed due to the magnetic field. The change of the rotation angle is obtained by irradiating the alkali metal vapor with the probe beam.

The alkali metal vapor is obtained by vaporizing the alkali metal by heating the alkali metal enclosed in a container called a cell. In order to vaporize the alkali metal enclosed in the cell, the optically pumped magnetic sensor is operated under a high temperature environment. Under a high temperature environment, there is a possibility that alkali metal atoms infiltrate into the interior of the materials constituting the cell. As a result, the densities of the alkali metal vapor (alkali metal atoms) existing in the internal space of the cell is decreased. Therefore, the detection sensitivity of the optically pumped magnetic sensor may be decreased.

An object of the present invention is to provide a cell for an optically pumped magnetic sensor capable of suppressing a decrease in detection sensitivity.

SUMMARY

A cell for a optically pumped magnetic sensor according to an aspect of the present invention measures magnetic field by setting alkali metal atoms to a predetermined excitation state by a pump beam and detecting the excitation state by a probe beam. The cell for the optically pumped magnetic sensor seals the alkali metal atoms and an enclosing gas and includes a container unit which transmits the pump beam and the probe beam and an inner coating film provided on an inner surface of the container unit. The inner coating film is made of an inorganic material.

DETAILED DESCRIPTION

A cell for an optically pumped magnetic sensor according to an aspect of the present invention measures magnetic field by setting alkali metal atoms to a predetermined excitation state by a pump beam and detecting the excitation state by a probe beam. The cell for the optically pumped magnetic sensor seals the alkali metal atoms and the enclosing gas and includes a container unit which transmits the pump beam and the probe beam and an inner coating film provided on an inner surface of the container unit. The inner coating film is made of an inorganic material.

The cell for the optically pumped magnetic sensor has an inner coating film provided on the inner surface of the container unit for sealing the alkali metal atoms. The inner coating film coats the inner surface of the container unit. That is, the inner coating film suppresses the infiltration of alkali metal atoms into the material constituting the cell. Therefore, the decrease in density of alkali metal atoms in the internal space of the cell is suppressed. As a result, the cell for the optically pumped magnetic sensor can suppress the decrease in detection sensitivity. Furthermore, the inner coating film is made of an inorganic material. The inner coating film made of the inorganic material is excellent in the resistance under a high temperature environment as compared with the film made of an organic material. Therefore, peeling and falling off of the inner coating film from the inner surface of the container unit can be suppressed under a high temperature environment. As a result, the cell for the optically pumped magnetic sensor can further suppress the decrease in detection sensitivity.

The cell for the optically pumped magnetic sensor may further include an outer coating film provided on the outer surface of the container unit. The cell is sealed with an enclosing gas for controlling vaporous alkali metal atoms (alkali metal vapor). According to the configuration, permeation of the enclosing gas from the container unit can be suitably suppressed.

In the optically pumped magnetic sensor cell, the container unit may have a main body portion which transmits the pump beam and the probe beam and a sealing-off portion which has a diameter smaller than that of the main body portion. Furthermore, the sealing-off portion may be provided so that the base end side of the sealing-off portion is connected to the main body portion and the distal end side of the sealing-off portion protrudes from the main body portion. According to the configuration, it is possible to suppress the influence of the sealing-off process on the main body portion that transmits the pump beam and the probe beam. As a result, it is possible to suitably form a container unit that seals the alkali metal atoms and the enclosing gas.

According to the present invention, the cell for the optically pumped magnetic sensor capable of suppressing the decrease in detection sensitivity is provided.

Hereinafter, embodiments of the present invention will be described in detail with reference to the attached drawings. In the description of the drawings, the same elements are denoted by the same reference symbols, and redundant description thereof is omitted.

Figure 1:
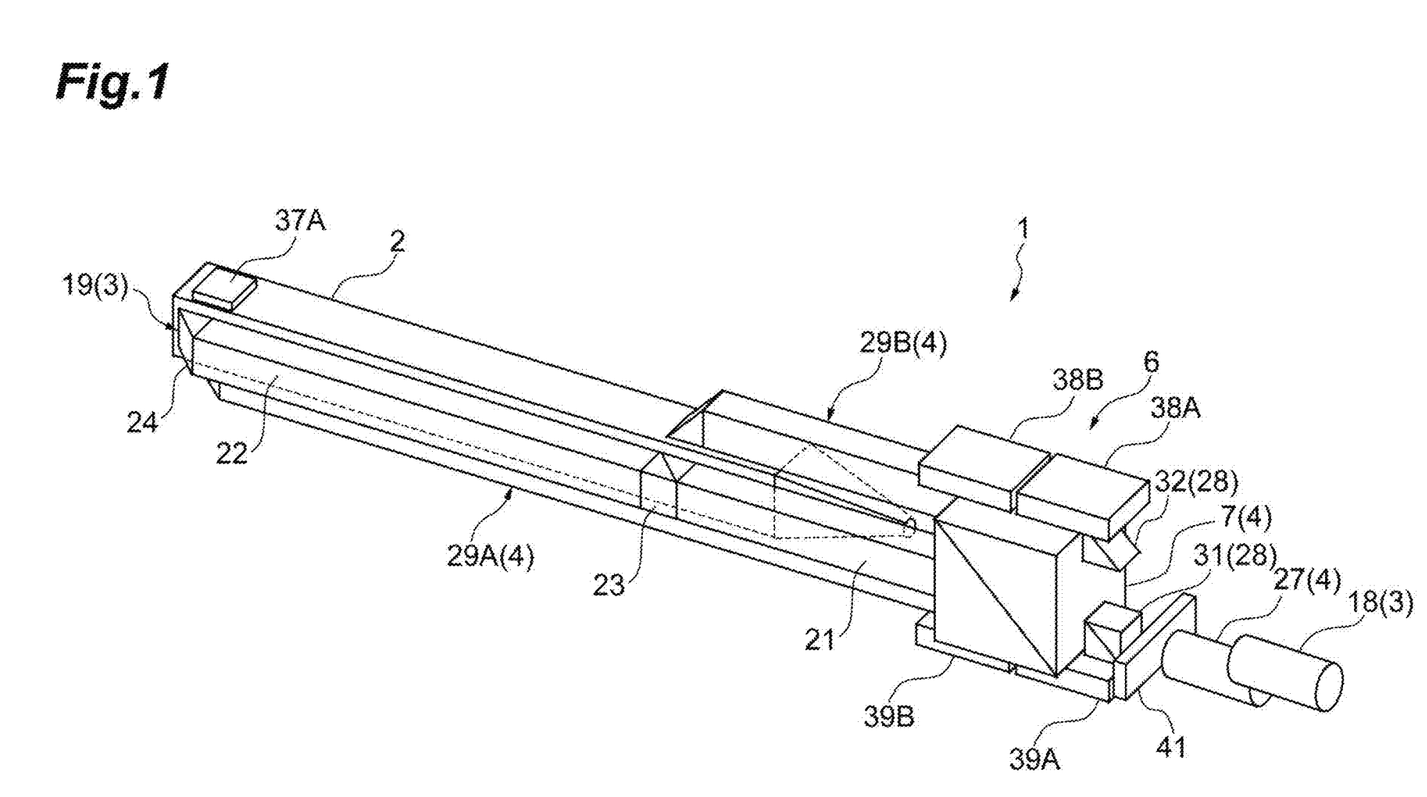
FIG. 1 is a perspective view of an optically pumped magnetic sensor according to an embodiment.
Figure 2:
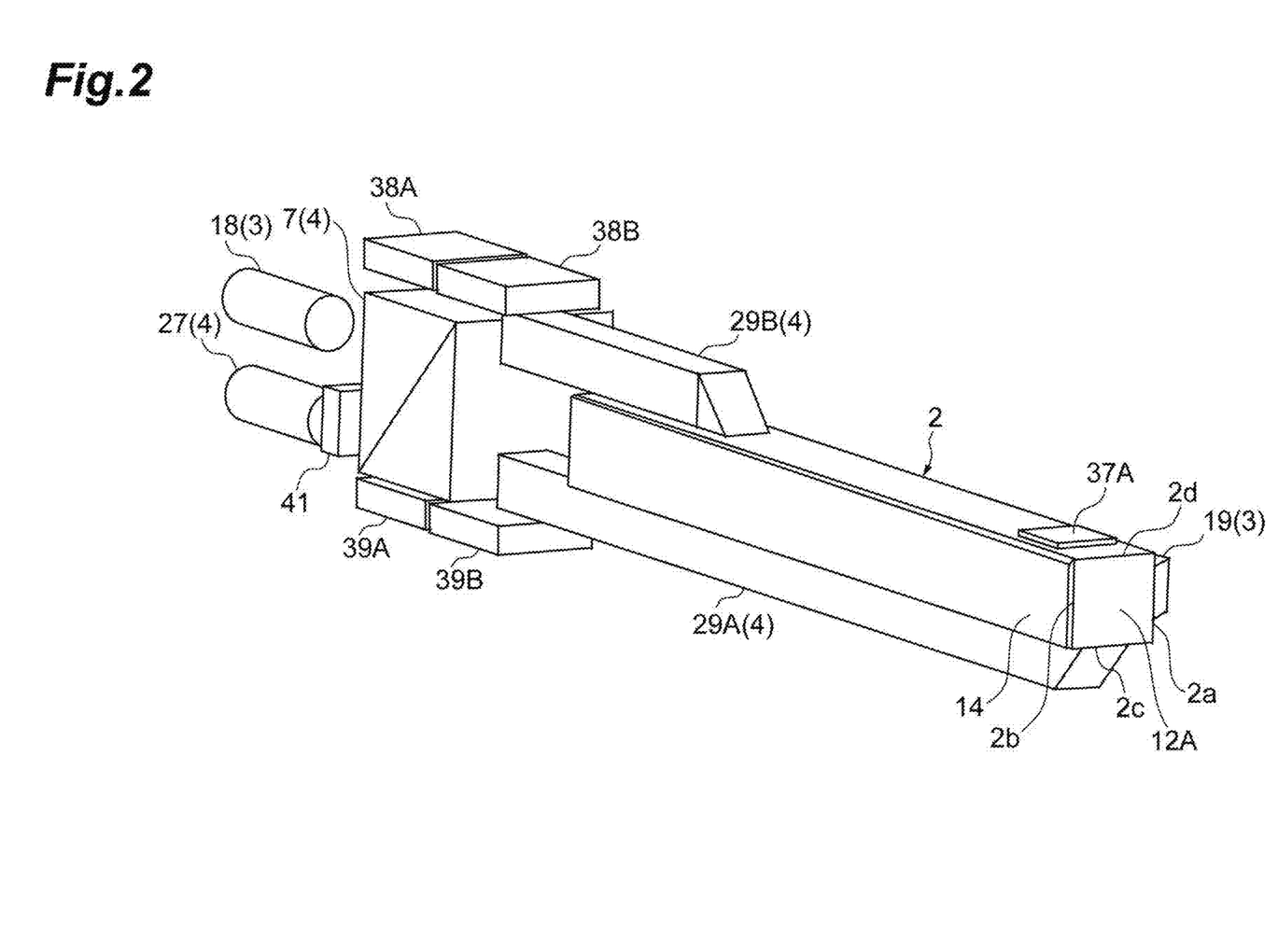
FIG. 2 is a perspective view of the optically pumped magnetic sensor according to the embodiment as viewed from a different direction.

As illustrated in FIGS. 1 and 2, the optically pumped magnetic sensor 1 includes a cell 2 (cell for a optically pumped magnetic sensor), a pump beam source 3, a probe beam source 4, and a light detection unit 6. The probe beam source 4 includes one polarization beam splitter 7. The optically pumped magnetic sensor 1 uses the polarization beam splitter 7 as a polarizing element through which the probe beam passes at the time of being incident on the cell 2. Furthermore, the optically pumped magnetic sensor 1 uses the polarization beam splitter 7 as a polarizing element at the time of detecting the signal from the cell 2. The cell 2 contains an alkali metal and an enclosing gas. The pump beam source 3 generates a pump beam. The vapor-like alkali metal atoms (alkali metal vapor) vaporized by heating the alkali metal are irradiated with the pump beam. In the alkali metal vapor irradiated with the pump beam, a predetermined spin polarization is generated. The alkali metal vapor in which spin polarization is generated can be used for the measurement of magnetic field. The probe beam source 4 generates probe beam. The probe beam detects a change in the direction of the spin polarization (change in rotation angle) in the alkali metal vapor. The probe beam source 4 irradiates each of two different measurement areas with the probe beam. According to such a configuration, the optically pumped magnetic sensor 1 constitutes a so-called gradiometer type sensor. The probe beam that has passed through the alkali metal vapor contains information indicating the excitation state of the alkali metal atoms. In other words, the probe beam that has passed through the alkali metal vapor contains information on the change in the direction of the spin polarization (change in rotation angle). The polarization beam splitter 7 splits a beam component having a polarization angle shifted from a predetermined polarization angle from the signal beam which is the probe beam which has passed through the alkali metal vapor. Then, the polarization beam splitter 7 provides the signal from which the beam component has been removed to the light detection unit 6. The light detection unit 6 detects signal light. Then, the light detection unit 6 outputs an electric signal according to the intensity of the detected signal light. The electric signal is processed by an information processing device (not illustrated) or the like. As a result of the processing, it is possible to obtain information on the magnetic field in a measurement object.

[Cell]

Figure 8:
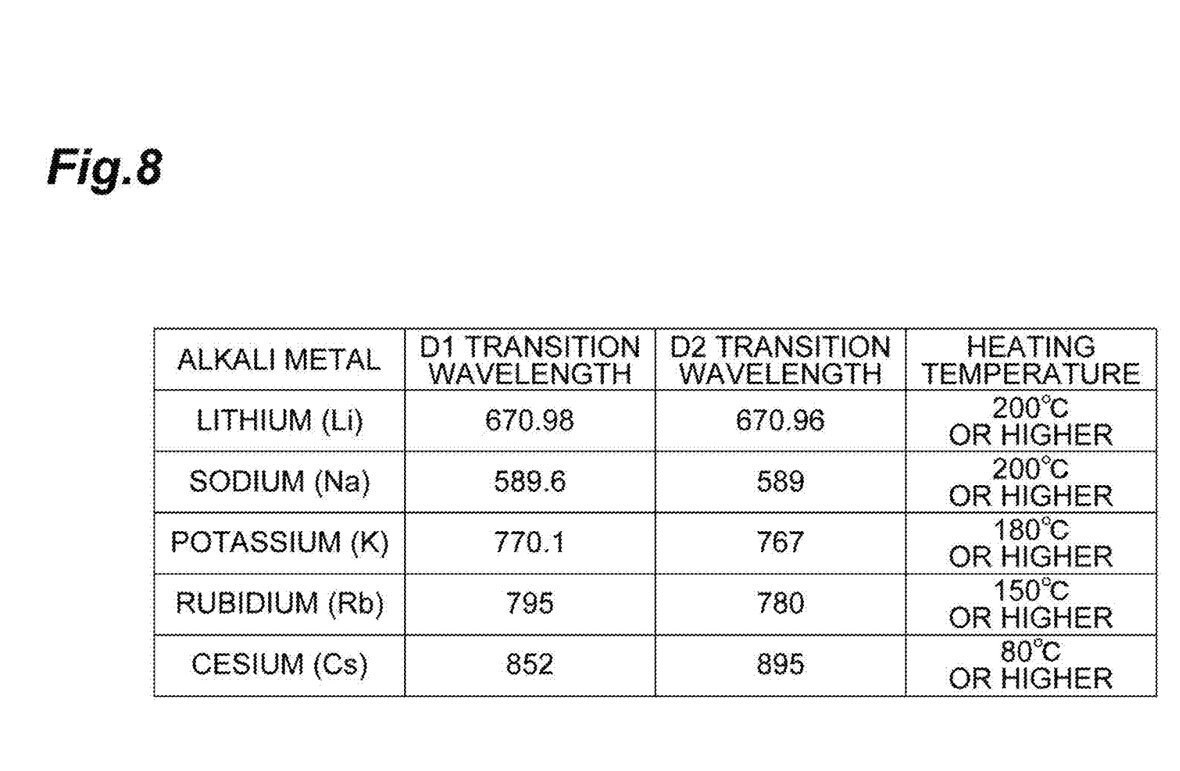
FIG. 8 is a table listing characteristics of alkali metals.

The cell 2 is an enclosing container made of glass. In the interior of the cell 2, an alkali metal (alkali metal vapor) and an enclosing gas are contained. In the present embodiment, the alkali metal is potassium (K). As shown in the table of FIG. 8, lithium (Li), sodium (Na), rubidium (Rb), or cesium (Cs) may be adopted as the alkali metal. The contained alkali metal may include at least one or more species. For example, the alkali metal may contain only potassium. In addition, for example, the alkali metal may contain potassium and rubidium.

The spin-destruction collision relaxation rate of potassium is the slowest among alkali-metal spin-destruction collision relaxation rates. Therefore, the detection sensitivity of magnetic field can be increased by using potassium as an alkali metal. For example, when comparing the spin-destruction collision relaxation rates of alkali metals, as an example, potassium:rubidium:cesium=1:10:100. In addition, when comparing the detection sensitivities of magnetic field, as an example, potassium:rubidium:cesium=1:3:10. That is, the smaller atomic number of an alkali metal is more preferable for high sensitivity.

The enclosing gas controls the alkali metal vapor. Specifically, the control of the alkali metal vapor includes suppression of relaxation of spin polarization of the alkali metal vapor, protection of the alkali metal vapor, and suppression of noise emission. As the enclosing gas, an inert gas is preferable. For example, helium (He), neon (Ne), argon (Ar), krypton (Kr), xenon (Xe), nitrogen ($N_2$), or hydrogen ($H_2$) may be adopted as a source of an inert gas.

The enclosing gas may be a mixed gas of two or more inert gases. The enclosing gas may be, for example, a mixed gas of helium and nitrogen (He:$N_2$=10:1). Helium functions as a buffer gas. Helium suppresses the spin-destruction collision relaxation caused by collision of alkali metal atoms with the inner surface of the cell 2. In addition, as the enclosing gas, atoms having low reactivity with alkali metal atoms are suitable. Furthermore, as the enclosing gas, atoms with smaller atomic numbers are more suitable. Therefore, it is preferable to adopt helium as the enclosing gas. In addition, nitrogen functions as a quenching gas. Specifically, nitrogen spin-collides with the alkali metal atoms. According to the collision, light emission noise due to de-excitation is suppressed. The higher enclosing pressure of the enclosing gas is more effective. For example, the enclosing pressure is 0.1 atm or more. As an example, the enclosing pressure may be a maximum of 4 atm.

Figure 3:
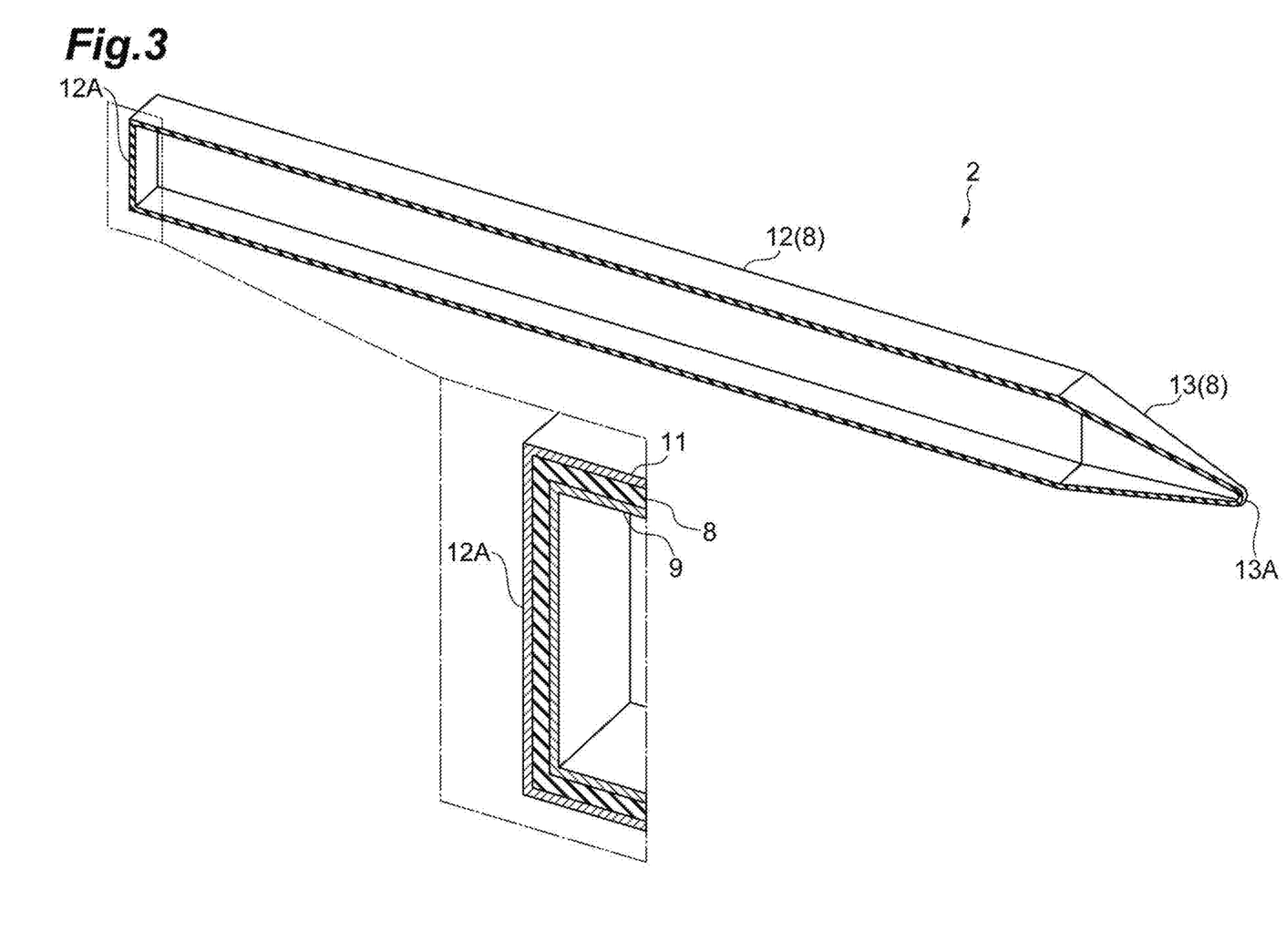
FIG. 3 is a perspective view illustrating a cross section of a cell provided in the optically pumped magnetic sensor of FIG. 1.

As illustrated in FIG. 3, the cell 2 includes a glass substrate 8 (container unit), a coating layer 9 (inner coating film), and a coating layer 11 (outer coating film). The glass substrate 8 forms a space for sealing the alkali metal (alkali metal vapor) and the enclosing gas.

As the material of the glass substrate 8, for example, quartz, sapphire, silicon, Kovar glass, or borosilicate glass (Pyrex (registered trademark) glass) may be adopted. In particular, a permeability coefficient of helium (He) of the Kovar glass is lower by one digit than that of the Pyrex (registered trademark) glass. Therefore, the thickness of the glass substrate 8 can be reduced by adopting the Kovar glass as the material of the glass substrate 8. Therefore, the adoption of the Kovar glass contributes to the miniaturization of the cell 2. Due to such a material, the pump beams 17A and 17B and the probe beams 26A and 26B described later can be allowed to be favorably transmitted. As a result, the pump beams 17A and 17B and the probe beams 26A and 26B can be suitably supplied to the alkali metal vapor in the interior of the cell 2. That is, for the glass substrate 8, a material having optical transparency to the pump beams 17A and 17B and the probe beams 26A and 26B may be adopted.

The glass substrate 8 has a cylindrical glass main body portion 12 and a sealing-off portion 13. The pump beams 17A and 17B and the probe beams 26A and 26B described later are transmitted through the glass main body portion 12. As a result, the alkali metal vapor is irradiated with the pump beams 17A and 17B and the probe beams 26A and 26B. The glass main body portion 12 also forms a space for sealing the alkali metal (alkali metal vapor) and the enclosing gas. The shape of the glass main body portion 12 is a substantially rectangular parallelepiped cylindrical shape extending in a predetermined axial direction. The cross-sectional shape of the glass main body portion 12 in the direction perpendicular to the axis is, for example, a square. One end (distal end) of the glass main body portion 12 is a flat surface. One end of the glass main body portion 12 is a magnetic field incident portion 12A facing the measurement object. At the other end (base end) of the glass main body portion 12, the sealing-off portion 13 is formed. The sealing-off portion 13 is a portion for performing a sealing-off operation at the time of sealing the cell 2. One end side (base end side) of the sealing-off portion 13 is connected to the other end of the glass main body portion 12. The other end side (distal end side) of the sealing-off portion is provided so as to protrude from the glass main body portion 12 in a predetermined axial direction. At the other end, a hermetically sealed sealing portion 13A is provided. The size of the cross section of the sealing-off portion 13 is smaller than the size of the cross section of the glass main body portion 12. The size of the cross section of the sealing-off portion 13 on the distal end side is smaller than the size of the cross section of the sealing-off portion 13 on the base end side. In particular, the size of the cross section of the sealing-off portion 13 is gradually decreased toward the sealing portion 13A. That is, a portion for sealing-off is provided separately from the glass main body portion 12. In addition, the sealing portion 13A is a portion of the sealing-off portion 13 most separated from the glass main body portion 12. The glass substrate 8 is sealed by the sealing portion 13A. With the configuration, it is possible to suppress the influence of heat and stress generated at the time of the sealing-off operation on the glass main body portion 12. As a result, it is possible to suppress the change in the optical transmission characteristics of the glass substrate 8 transmitting the pump beams 17A and 17B and the probe beams 26A and 26B described later due to the sealing-off operation. Furthermore, the sealing-off operation is performed at a portion having a cross section smaller than that of the glass main body portion 12. As a result, the sealing-off operation can be facilitated. Furthermore, it is possible to suppress the generation of heat and stress occurring according to the sealing-off operation. In addition, the enclosing gas can be contained also in the interior of the sealing-off portion 13. Therefore, the absolute amount of the enclosing gas in the cell 2 can also be increased.

During the operation of the optically pumped magnetic sensor 1, the cell 2 needs to be disposed under a high temperature environment in order to convert the solid alkali metal to the gaseous alkali metal. In the interior of the cell 2 disposed under a high temperature environment, there is a possibility that vaporous alkali metal atoms infiltrate into the interior of the glass substrate 8 constituting the cell 2. There is also a possibility that the enclosing gas permeates through the glass substrate 8. The coating layers 9 and 11 suppress the infiltration of the alkali metal atoms into the glass substrate 8 and suppress the permeation of the enclosing gas through the glass substrate 8.

The coating layer 9 is provided on the entire inner surface (inner wall surface) of the glass main body portion 12 in the glass substrate 8. In addition, it is preferable that the coating layer 9 is provided on the entire surface of the region excluding the inner surface (inner wall surface) of at least the sealing portion 13A also on the inner surface (inner wall surface) of the sealing-off portion 13. The coating layer 9 mainly suppresses the infiltration of alkali metal atoms into the glass substrate 8. In addition, the coating layer 9 suppresses the permeation of the enclosing gas through the glass substrate 8. Furthermore, the coating layer 9 transmits the pump beams 17A and 17B and the probe beams 26A and 26B.

The coating layer 11 is provided on the outer surface (outer wall surface) of the glass main body portion 12 in the glass substrate 8. Preferably, the coating layer 11 is provided on the entire outer surface of the glass main body portion 12. In addition, the coating layer 11 is also provided on the outer surface (outer wall surface) of the sealing-off portion 13. Preferably, the coating layer 11 is provided on the entire outer surface of the sealing-off portion 13. However, the outer surface (outer wall surface) of the sealing portion 13A is relatively small with respect to the entire glass substrate 8. Therefore, the coating layer 11 may or may not be provided on the sealing portion 13A. The coating layer 11 mainly suppresses the permeation of the enclosing gas through the glass substrate 8. Furthermore, the coating layer 11 transmits the pump beams 17A and 17B and the probe beams 26A and 26B.

As the material of the coating layers 9 and 11, an inorganic material may be adopted. In addition, the inorganic material in the present embodiment also includes a metal material. Inorganic materials are superior to organic materials in resistance to a high temperature environment. The detection sensitivity of magnetic field of the optically pumped magnetic sensor 1 is affected by the density of alkali metal vapor (alkali metal atoms) existing in the internal space of the cell 2. Specifically, as the density of the alkali metal vapor is increased, the detection sensitivity of magnetic field is increased. The density of the alkali metal vapor can be controlled by temperature. In order to increase the density of the alkali metal vapor, it is sufficient to raise the temperature. By using an inorganic material that is relatively resistant to a high temperature environment as the coating layers 9 and 11, it is possible to raise the temperature of the alkali metal vapor to 200° C. or higher (for example, about 220° C.). As a result, the detection sensitivity of magnetic field can be increased.

As the material of the coating layers 9 and 11, for example, aluminum oxide ($Al_2O_3$), titanium oxide ($TiO_2$), zinc oxide (ZnO), silicon oxide ($SiO_2$), magnesium oxide (MgO), platinum (Pt), and the like may be adopted. As a method of forming the coating layers 9 and 11, vapor deposition, coating, and the like may be used. The coating layers 9 and 11 may be formed on the components before the glass substrate 8 is assembled. The coating layers 9 and 11 may be formed on the assembled glass substrate 8. However, in order to suppress the influence of the coating layers 9 and 11 at the time of assembling the glass substrate 8 and to faun the more uniform coating layers 9 and 11, it is preferable that the formation of the coating layers 9 and 11 is performed by vapor deposition after the glass substrate 8 is assembled. As the vapor deposition, atomic layer deposition (ALD) is preferably used. In a case where the coating layer 9 is formed inside the glass substrate 8, the material is introduced through the opening of the sealing-off portion 13 before the sealing-off. According to the process, the coating layers 9 and 11 can be formed collectively. Furthettnore, according to the process, it is possible to obtain dense and strong coating layers 9 and 11 free of foreign matters. For example, the coating layers 9 and 11 are preferably layers made of aluminum oxide ($Al_2O_3$) formed by ALD. In addition, the coating layers 9 and 11 may be laminated films made of these materials. In other words, the coating layers 9 and 11 may have a plurality of films. For example, the coating layers 9 and 11 may be made of aluminum oxide ($Al_2O_3$) alone. The coating layers 9 and 11 may be formed by laminating aluminum oxide ($Al_2O_3$) and titanium oxide ($TiO_2$). By combining titanium oxide ($TiO_2$) with aluminum oxide ($Al_2O_3$), it is possible to suppress degeneration of aluminum oxide ($Al_2O_3$) due to moisture by titanium oxide ($TiO_2$).

The thickness of the coating layers 9 and 11 is, for example, 1 nm or more and 1000 nm or less. In some cases, if the coating layers 9 and 11 are too thin (for example, 1 nm or less), holes such as pinholes which are unformed regions may exist, and thus, sufficient effects may not be obtained. In addition, if the coating layers 9 and 11 are too thick (for example, 1000 nm or more), there is a possibility that the transmittance of the pump beams 17A and 17B and the probe beams 26A and 26B is decreased. As an example, the thickness of the coating layers 9 and 11 is 20 nm.

The coating layers 9 and 11 suitably suppress the infiltration of the alkali metal atoms into the glass substrate 8 even under a high temperature environment for enhancing detection sensitivity. Furthermore, the coating layers 9 and 11 suitably suppress the permeation of the enclosing gas through the glass substrate 8 even under a high temperature environment. The coating layers 9 and 11 are made of an inorganic material. Inorganic materials are superior to organic materials in resistance to a high temperature environment. Therefore, peeling and falling off of the coating layers 9 and 11 under a high temperature environment can be suppressed. In a case where the peeling and falling off of the coating layers 9 and 11 occur, it is difficult to suppress the infiltration of the alkali metal atoms into the glass substrate 8 and the permeation of the enclosing gas from the glass substrate 8. Furthermore, in a case where the peeling and falling off of the coating layers 9 and 11 occur in the transmission regions of the pump beam and probe beam, there is a possibility that the optical transmission characteristics are changed. In addition, if the coating layer 9 provided inside the glass substrate 8 is peeled off and falls off, the peeled and fallen materials become foreign matters existing inside the glass substrate 8. There is also a possibility that the foreign matters affect the measurement. In addition, there is a possibility that an outgas occurs due to a material contained in the glass substrate 8. Alternatively, there is a possibility that an outgas occurs due to a material that has infiltrated into the glass substrate 8 from the external environment of the glass substrate 8. The coating layers 9 and 11 suppress the oxidation of alkali metal atoms by the outgas. As a result, consumption of the alkali metal atoms can be suppressed. Therefore, the decrease in the density of the alkali metal vapor (alkali metal atoms) is suppressed also in the interior of the cell 2 under a high temperature environment. As a result, the decrease in detection sensitivity can be suppressed.

As mentioned above, for any one of the alkali metal and the enclosing gas, atoms with small atomic numbers such as, for example, potassium or helium are preferred. In that case, it is necessary to raise the operating environment temperature. In addition, the enclosing gas is likely to permeate through the glass substrate 8. Therefore, the coating layers 9 and 11 are provided, the use under a high temperature environment is enabled. Furthermore, permeation of the enclosing gas through the glass substrate 8 can be suppressed. As a result, materials with small atomic numbers can be used for any one of the alkali metal and the enclosing gas. Therefore, improvement in detection sensitivity can be expected.

A heater 14 (refer to FIG. 2) is attached to the cell 2. The heater 14 heats the alkali metal contained in the interior of the cell 2. As a result, since the alkali metal is vaporized, the alkali metal vapor is generated. The heater 14 also controls the temperature in order to control the density of the alkali metal vapor. The cell 2 has cell side surfaces 2a, 2b, 2c, and 2d as outer side surfaces. The heater 14 is attached to the cell side surface 2b. The cell side surface 2b faces the cell side surface 2a. For example, a light waveguide unit 19 for a pump beam 17 described later is provided on the cell side surface 2a. Similarly, the cell side surface 2c faces the cell side surface 2d.

[Pump Beam Source]

Figure 4:
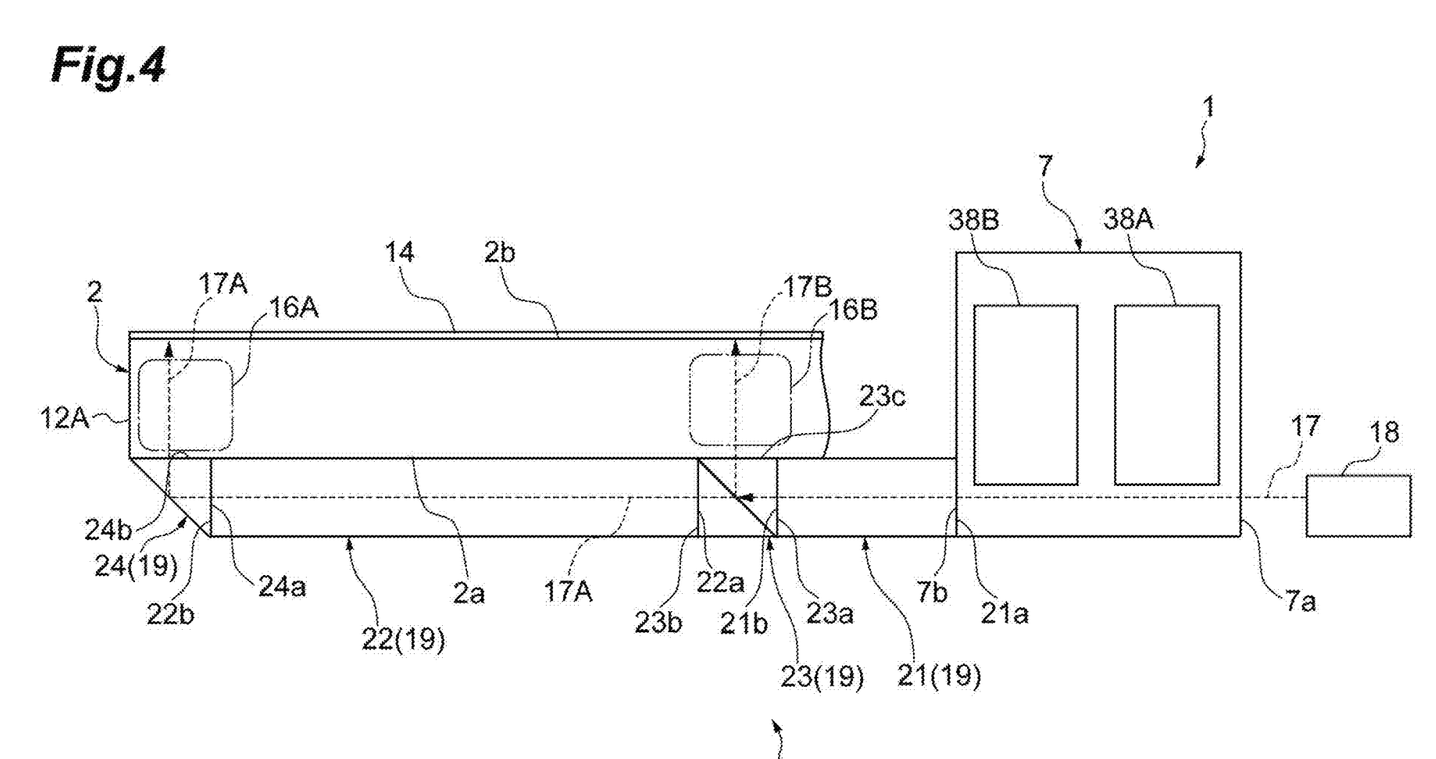
FIG. 4 is a diagram illustrating a configuration of a pump beam source.

As illustrated in FIG. 4, the pump beam source 3 irradiates the measurement area 16A provided in the cell 2 with the pump beam 17A. In addition, the pump beam source 3 irradiates the measurement area 16B provided in the cell 2 with the pump beam 17B. The measurement area 16A is set to an area facing the magnetic field incident portion 12A on the distal end side of the cell 2. The measurement area 16A detects the magnetic field of the magnetic field source (measurement object). The measurement area 16B is set on the base end side of the cell 2. The measurement area 16B detects an external magnetic field. The external magnetic field is referred to as, for example, an environmental magnetic field that is not originated from the measurement object. The external magnetic field is an external noise component. The pump beam source 3 includes a light source 18 (first light source) and a light waveguide unit 19.

The light source 18 emits pump beam 17 in the direction of the optical axis. The light source 18 emits, for example, a laser. The wavelength of the pump beam 17 depends on the type of atoms constituting the alkali metal vapor. For example, in a case where potassium is adopted as the alkali metal, the wavelength of the pump beam 17 is 770.1 nm.

The light waveguide unit 19 guides the pump beam 17 from the light source 18 to a predetermined area of the cell 2 by wave-guiding, reflection, and transmission. Specifically, the light waveguide unit 19 guides the pump beam 17A to the measurement area 16A of the cell 2. As a result, the measurement area 16A is irradiated with the pump beam 17A. In addition, the light waveguide unit 19 guides the pump beam 17B to the measurement area 16B of the cell 2. As a result, the measurement area 16B is irradiated with the pump beam 17B. More specifically, the light waveguide unit 19 guides the pump beam 17A to the measurement area 16A set on the distal end side of the cell 2. As a result, the measurement area 16A is irradiated with the pump beam 17A. The light waveguide unit 19 guides the pump beam 17B to the measurement area 16B set on the base end side of the cell 2. As a result, the measurement area 16B is irradiated with the pump beam 17B. The light waveguide unit 19 guides light such that the incident directions of the pump beams 17A and 17B are perpendicular to the extending direction of the cell 2. The pump beams 17A, 17B excite the alkali metal vapor. Therefore, the area irradiated with the pump beams 17A and 17B is the measurement position of the magnetic field.

The light waveguide unit 19 includes waveguides 21 and 22 and prism mirrors 23 and 24. The light rays of the waveguides 21 and 22 are coaxial with the optical axis of the prism mirrors 23 and 24. In other words, the optical axes of the waveguides 21 and 22 coincide with the optical axes of the prism mirrors 23 and 24.

The waveguides 21 and 22 constitute an optical path of the pump beams 17, 17A and 17B. The waveguides 21 and 22 are prismatic optical components extending in the direction of the optical axis. The waveguides 21 and 22 are juxtaposed along the optical axis of the light source 18 along the optical axis. The waveguides 21 and 22 extend along the axial direction of the cell 2. At least a portion of the waveguides 21 and 22 is disposed along the cell side surface 2a. In addition, at least a portion of the waveguides 21 and 22 may be disposed on the cell side surface 2a. The waveguide 21 is disposed on the base end side of the cell 2. The waveguide 22 is disposed on the distal end side of the cell 2. That is, the waveguide 21 is closer to the light source 18 than the waveguide 22.

The prism mirror 23 is disposed between the waveguides 21 and 22. The prism mirror 23 is optically connected to the waveguides 21 and 22. The prism mirror 24 is optically connected to the distal end portion of the waveguide 22. The prism mirrors 23 and 24 transmit and reflect the pump beams 17, 17A, and 17B. More specifically, the prism mirror 23 reflects a portion of components of the pump beam 17 as the pump beam 17B. In addition, the prism mirror 23 transmits the remaining components of the pump beam 17 as the pump beam 17A. That is, the prism mirror 23 splits the pump beam 17 into the pump beam 17A and the pump beam 17B. The prism mirror 24 reflects the entire pump beam 17A.

The waveguide 21 has a light input surface 21a and a light output surface 21b.

The light input surface 21a is an end surface of the waveguide 21 on the base end side. The light input surface 21a is optically connected to the polarization beam splitter 7 described later. The polarization beam splitter 7 is disposed between the light source 18 and the waveguide 21. The pump beam 17 transmitted through the polarization beam splitter 7 is incident on the light input surface 21a.

The light output surface 21b is an end surface of the waveguide 21 on the distal end side. The prism mirror 23 is optically connected to the light output surface 21b. The light output surface 21b emits the pump beam 17 to the prism mirror 23.

The prism mirror 23 has a light input surface 23a and light output surfaces 23b and 23c. The light input surface 23a which is on the base end side is optically connected to the light output surface 21b of the waveguide 21. The pump beam 17 is incident on the light input surface 23a. The light output surface 23b which is on the distal end side is optically connected to the waveguide 22. The light output surface 23b emits the pump beam 17A to the waveguide 22. The light output surface 23c facing the cell 2 is optically connected to the cell side surface 2a (first cell light connection portion). The light output surface 23c emits the pump beam 17B to the cell side surface 2a. As a result, the measurement area 16B is irradiated with the pump beam 17B.

The waveguide 22 has a light input surface 22a and a light output surface 22b.

The light input surface 22a is an end surface of the waveguide 22 on the base end side. The light input surface 22a is optically connected to the light output surface 23b of the prism mirror 23. The pump beam 17A from the prism mirror 23 is incident on the light input surface 22a.

The light output surface 22b is an end surface of the waveguide 22 on the distal end side. The prism mirror 24 is optically connected to the light output surface 22b. The light output surface 22b emits the pump beam 17A to the prism mirror 24.

The prism mirror 24 has a light input surface 24a and a light output surface 24b. The light input surface 24a which is on the base end side is optically connected to the light output surface 22b of the waveguide 22. The pump beam 17A is incident on the light input surface 24a. The light output surface 24b facing the cell 2 is optically connected to the cell side surface 2a. The light output surface 24b emits the pump beam 17A to the cell side surface 2a. As a result, the measurement area 16A is irradiated with the pump beam 17A.

[Probe Beam Source]

Figure 5:
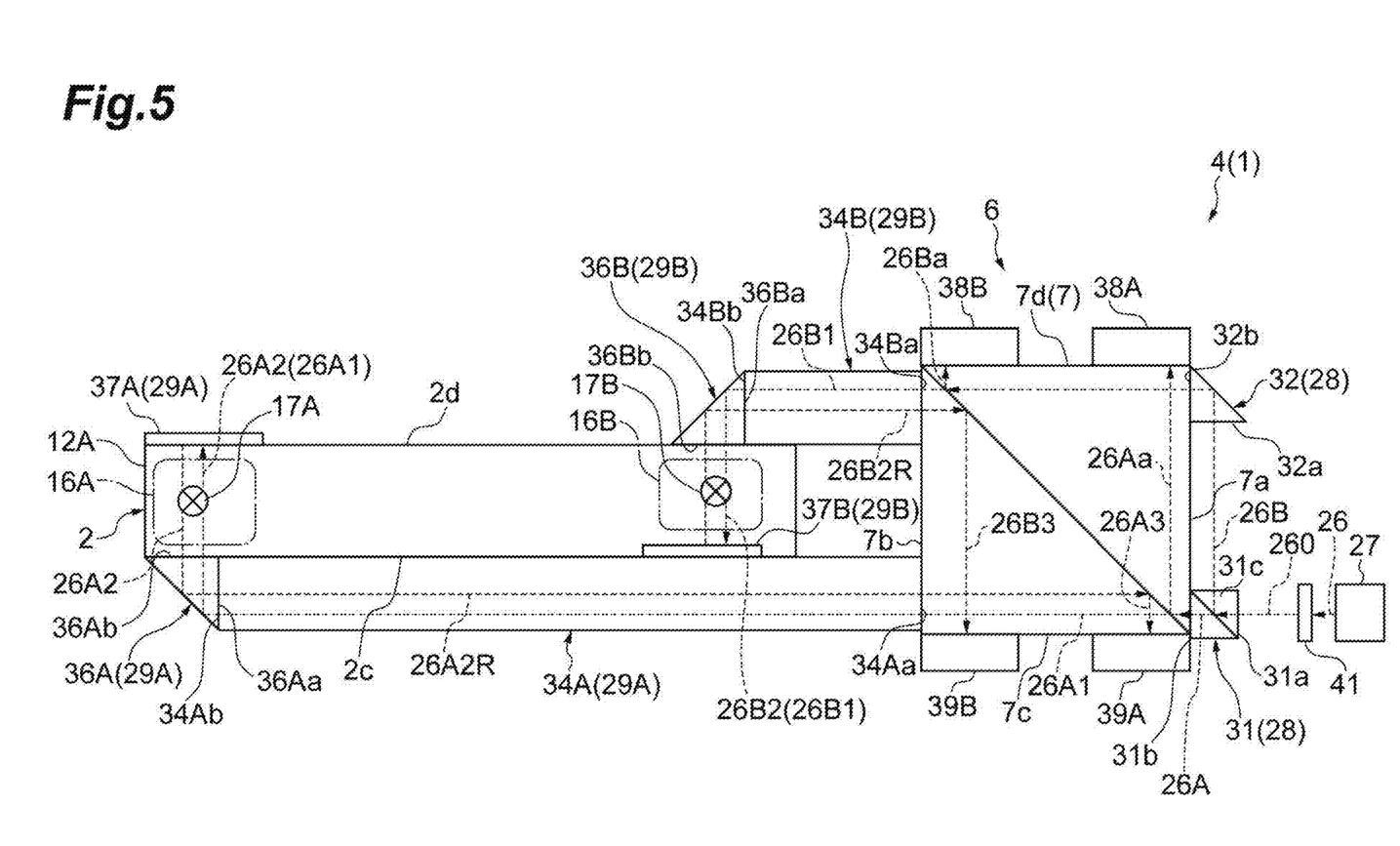
FIG. 5 is a diagram illustrating a configuration of a probe beam source.

As illustrated in FIG. 5, the probe beam source 4 irradiates the measurement area 16A of the cell 2 with a probe beam 26A1. The probe beam source 4 irradiates the measurement area 16B of the cell 2 with a probe beam 26B1. The probe beam source 4 includes a light source 27 (second light source), a beam splitting unit 28, a polarization beam splitter 7, light waveguide units 29A and 29B (optical members), and a polarizing plate 41.

The probe beam 26 (first probe beam) emitted from the light source 27 is transmitted through the polarizing plate 41 to be a probe beam 260. The probe beam 260 is split into probe beams 26A and 26B in the beam splitting unit 28. The probe beams 26A and 26B are incident on the polarization beam splitter 7, respectively. The transmitted components are provided to the light waveguide units 29A and 29B. The polarization beam splitter 7 splits the probe beams 26A and 26B into the probe beams 26A1 and 26B1 (second probe beams) as transmitted components and probe beams 26Aa and 26Ba (third probe beams) as reflected components. The probe beams 26A1 and 26B1 contain light components having a predetermined polarization angle transmitted through the polarization beam splitter 7. The probe beams 26Aa and 26Ba contain light components having a polarization angle different from the predetermined polarization angle reflected by the polarization beam splitter 7. The light waveguide unit 29A guides the probe beam 26A1 to the measurement area 16A. As a result, the measurement area 16A is irradiated with the probe beam 26A1. A probe beam 26A2 (signal light) transmitted through the measurement area 16A is reflected by a mirror 37A (reflection unit) described later. The reflected probe beam 26A becomes a probe beam 26A2R (reflected signal light). The light waveguide unit 29A guides the probe beam 26A2R (reflected signal light) to the polarization beam splitter 7. The light waveguide unit 29B guides the probe beam 26B1 to the measurement area 16B. As a result, the measurement area 16B is irradiated with the probe beam 26B1. A probe beam 26B2 (signal light) having passed through the measurement area 16B is reflected by a mirror 37B (reflection unit) described later. The reflected probe beam 26B2 becomes a probe beam 26B2R (reflected signal light). The light waveguide unit 29B guides the probe beam 26B2R (reflected signal light) to the polarization beam splitter 7. The polarization beam splitter 7 guides the probe beam 26A2R supplied from the light waveguide unit 29A to the light detection unit 6. The polarization beam splitter 7 guides the probe beam 26B2R supplied from the light waveguide unit 29B to the light detection unit 6.

The light source 27 emits the probe beam 26 in the direction of the optical axis. The light source 27 emits, for example, a laser. The wavelength of the probe beam 26 depends on the type of atoms constituting the alkali metal vapor. For example, in a case where potassium is adopted as the alkali metal vapor, the wavelength of the probe beam 26 is slightly detuned from the wavelength of 770.1 nm which is the wavelength of the pump beam 17. As a result, absorption is suppressed.

The polarizing plate 41 is disposed between the light source 27 and the polarization beam splitter 7. More specifically, the polarizing plate 41 is disposed between the light source 27 and a prism mirror 31 described later. The polarizing plate 41 transmits light having a specific polarization angle. The polarizing plate 41 reduces the light amount of the light component having a polarization angle different from the specific polarization angle.

The beam splitting unit 28 has prism mirrors 31 and 32. The prism mirror 31 transmits a portion of light components of the probe beam 260. The transmitted light component is the probe beam 26A. The prism mirror 31 reflects the remaining light components of the probe beam 260. The reflected light components are the probe beam 26B (split probe beam). That is, the prism mirror 31 splits the probe beam 260 into the probe beam 26A and the probe beam 26B (split probe beam). The prism mirror 32 converts the traveling direction of the probe beam 26B.

The prism mirror 31 is disposed on the optical axis of the light source 27. The prism mirror 31 has a light input surface 31a and light output surfaces 31b and 31c. The light input surface 31a faces the light source 27. The light output surface 31b faces the polarization beam splitter 7. The light output surface 31b emits the probe beam 26A to the polarization beam splitter 7. The light output surface 31c faces the prism mirror 32. The light output surface 31b emits the probe beam 26B to the prism mirror 32.

The prism mirror 32 is disposed on the optical axis of the probe beam 26B supplied from the prism mirror 31. The optical axis of the probe beam 26B is perpendicular to the optical axis of the light source 27. The prism mirror 32 has a light input surface 32a and a light output surface 32b. The light input surface 32a faces the light output surface 31c of the prism mirror 31. The probe beam 26B is incident on the light input surface 32a. The prism mirror 32 converts the traveling direction of the incident probe beam 26B by 90 degrees. The light input surface 32a is optically connected to the polarization beam splitter 7. The light input surface 32a emits the probe beam 26B to the polarization beam splitter 7.

When the probe beams 26A and 26B are incident, the polarization beam splitter 7 emits probe beams 26A1 and 26B1 and probe beams 26Aa and 26Ba. The probe beams 26A1 and 26B1 have a predetermined polarization angle. The probe beams 26Aa and 26Ba have a polarization angle different from the predetermined polarization angle. That is, the probe beam 26A is split into the probe beam 26A1 and the probe beam 26Aa by the polarization beam splitter 7. The probe beam 26B is split into the probe beam 26B1 and the probe beam 26Ba by the polarization beam splitter 7. The probe beams 26A1 and 26B1 are so-called transversely polarized light. The probe beams 26Aa and 26Ba are so-called longitudinally polarized light.

The shape of the polarization beam splitter 7 is a cube. The polarization beam splitter 7 has a light input surface 7a (first splitter light connection portion), a light output surface 7b (second splitter light connection portion), and light output surfaces 7c and 7d. The shape of the polarization beam splitter 7 is not limited to a cubic shape. The shape of the polarization beam splitter 7 may be another shape such as a flat plate.

The light input surface 7a faces the light source 27. The beam splitting unit 28 is provided on the light input surface 7a. More specifically, the light input surface 7a is optically connected to the light output surface 31b of the prism mirror 31 of the beam splitting unit 28. The prism mirror 31 is disposed on one side (the side closer to the light output surface 7c) of the light input surface 7a. Furthermore, the light input surface 7a is optically connected to the light output surface 32b of the prism mirror 32 of the beam splitting unit 28. The prism mirror 32 is disposed on the other side (the side closer to the light output surface 7d) of the light input surface 7a.

The light output surface 7b faces the light input surface 7a. The light output surface 7b is a surface on the side opposite to the light input surface 7a. The light output surface 7b emits the probe beam 26A1 and 26B1 which are transversely polarized light. The light output surface 7b is optically connected to the light waveguide units 29A and 29B.

A pair of the light output surfaces 7c and 7d connect the light input surface 7a and the light output surface 7b. The light output surfaces 7c and 7d face each other. The light output surface 7c emits probe beams 26A3 and 26B3. The light output surface 7d emits probe beams 26Aa and 26Ba which are longitudinally polarized light.

The light waveguide unit 29A guides the probe beam 26A1 emitted from the polarization beam splitter 7 to the measurement area 16A. As a result, the measurement area 16A is irradiated with the probe beam 26A1. The light waveguide unit 29A includes a waveguide 34A, a prism mirror 36A, and a mirror 37A (reflection unit). These optical elements constitute an optical path for the probe beams 26A1 and 26A2R.

The waveguide 34A constitutes the optical path for the probe beams 26A1 and 26A2R. The waveguide 34A is a prismatic member extending in the direction of the optical axis. The waveguide 34A extends along the axial direction of the cell 2. At least a portion of the waveguide 34A is disposed along the cell side surface 2c. At least a portion of the waveguide 34A may be disposed on the cell side surface 2c. The waveguide 34A has a light input surface 34Aa (first end surface) and a light output surface 34Ab (second end surface).

The light input surface 34Aa is an end surface of the waveguide 34A on the base end side. The light input surface 34Aa is optically connected to the light output surface 7b of the polarization beam splitter 7. The prism mirror 31 and the polarization beam splitter 7 are disposed between the light source 27 and the waveguide 34A. The probe beam 26A1 transmitted through the polarization beam splitter 7 is incident on the light input surface 34Aa.

The light output surface 34Ab is an end surface of the waveguide 34A on the distal end side. The prism mirror 36A is optically connected to the light output surface 34Ab. The light output surface 34Ab emits the probe beam 26A1 to the prism mirror 36A.

The prism mirror 36A has a light input surface 36Aa and a light output surface 36Ab. The light input surface 36Aa which is on the base end side is optically connected to the light output surface 34Ab of the waveguide 34A. The probe beam 26A1 is incident on the light input surface 36Aa. The light output surface 36Ab facing the cell 2 is optically connected to the distal end side of the cell side surface 2c (second cell light connection portion). The light output surface 36Ab emits the probe beam 26A1 to the cell 2. Therefore, the position where the prism mirror 36A is disposed corresponds to the position of the measurement area 16A.

The mirror 37A is provided on the cell side surface 2d. The cell side surface 2d faces the cell side surface 2c provided with the prism mirror 36A. The mirror 37A faces the light output surface 36Ab of the prism mirror 36A. The mirror 37A reflects the probe beam 26A2 that has passed through the measurement area 16A. As a result, probe beam 26A2R which is a returning beam is formed.

The light waveguide unit 29B guides the probe beam 26B1 emitted from the polarization beam splitter 7 to the measurement area 16B. As a result, the measurement area 16B is irradiated with the probe beam 26B1. The light waveguide unit 29B includes a waveguide 34B, a prism mirror 36B, and a mirror 37B (mirror unit). These optical elements constitute an optical path for the probe beams 26B1 and 26B2R.

The waveguide 34B constitutes an optical path for the probe beams 26B1 and 26B2R. The waveguide 34B is a prismatic optical component extending in the direction of the optical axis. The waveguide 34B extends along the axial direction of the cell 2. At least a portion of the waveguide 34B is disposed along the cell side surface 2d. At least a portion of the waveguide 34B may be disposed on the cell side surface 2d. The waveguide 34B has a light input surface 34Ba and a light output surface 34Bb.

The light input surface 34Ba is an end surface of the waveguide 34B on the base end side. The light input surface 34Ba is optically connected to the light output surface 7b of the polarization beam splitter 7. The probe beam 26B1 transmitted through the polarization beam splitter 7 is incident on the light input surface 34Ba.

The light output surface 34Bb is an end surface of the waveguide 34B on the distal end side. The prism mirror 36B is optically connected to the light output surface 34Bb. The light output surface 34Bb emits the probe beam 26B1 to the prism mirror 36B.

The prism mirror 36B has a light input surface 36Ba and a light output surface 36Bb. The light input surface 36Ba which is on the base end side is optically connected to the light output surface 34Bb of the waveguide 34B. The probe beam 26B1 is incident on the light input surface 36Ba. The light output surface 36Bb facing the cell 2 is optically connected to the base end side of the cell side surface 2d. Therefore, the position where the prism mirror 36B is disposed corresponds to the position of the measurement area 16B.

The mirror 37B (reflection unit) is provided on the cell side surface 2c. The cell side surface 2c faces the cell side surface 2d provided with the prism mirror 36B. The mirror 37B faces the light output surface 36Bb of the prism mirror 36B. The mirror 37B reflects the probe beam 26B2 that has passed through the measurement area 16B. As a result, probe beam 26B2R which is a returning beam is formed.

Figure 6:
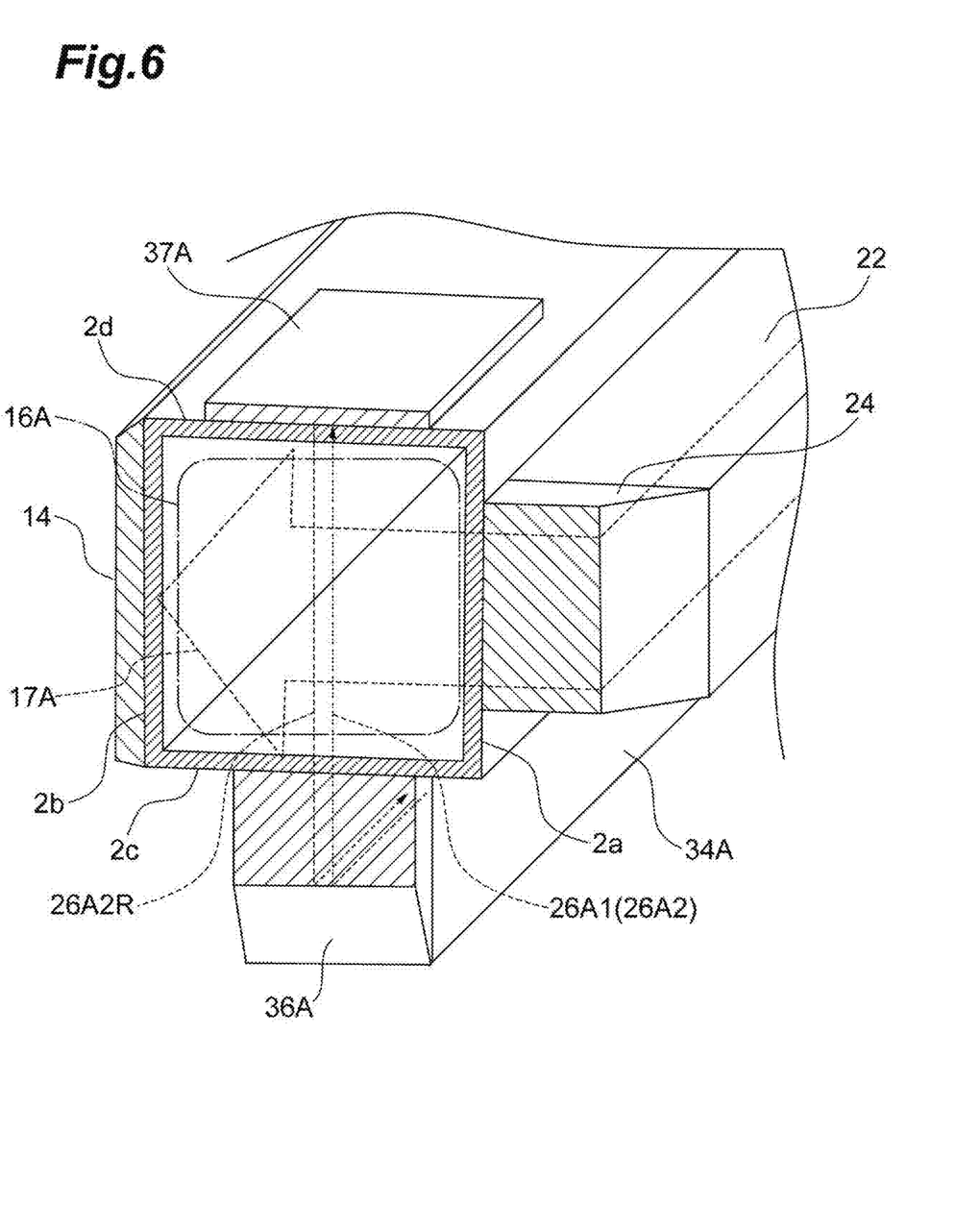
FIG. 6 is a view illustrating a relationship between pump beam and probe beam.

Herein, the relationship between the pump beam 17A and the probe beam 26A1 will be described with reference to FIG. 6. As illustrated in FIG. 6, the pump beam 17A is emitted from the prism mirror 24 provided on the cell side surface 2a. The pump beam 17A travels in the normal direction of the cell side surface 2a. The pump beam 17 reaches the cell side surface 2b on the side opposite to the cell side surface 2a provided with the heater 14. The pump beam 17 may excite the alkali metal vapor in the measurement area 16A. Therefore, the cell 2 may have one input surface of the pump beam, on which the pump beam 17 is incident on one measurement area.

The probe beam 26A1 is emitted from the prism mirror 36A provided on the cell side surface 2c. The cell side surface 2c is perpendicular to the cell side surfaces 2a and 2b. In other words, the angle between the cell side surfaces 2a and 2c is a right angle. The probe beam 26A1 travels in the normal direction of the cell side surface 2c. At time of being incident on the cell 2, the probe beam 26A1 is also the probe beam 26A2. Then, the cell side surfaces 2a and 2c are perpendicular to each other. As a result, the traveling direction of the pump beam 17A is perpendicular to the traveling direction of the probe beam 26A1. The probe beam 26A1 (probe beam 26A2) that has passed through the measurement area 16A is reflected by the mirror 37A provided on the cell side surface 2d. The probe beam 26A1 passes through the alkali metal vapor in the measurement area 16A to become the probe beam 26A2. After that, the probe beam 26A2 is reflected by the mirror 37A. As a result, the probe beam 26A2 becomes the probe beam 26A2R. The probe beam 26A2R returns to the prism mirror 36A again. Therefore, the cell 2 has an input surface for receiving the probe beam 26A1 and an output surface for extracting the probe beam 26A2R for one measurement area 16A. The input surface and the output surface may be common as in the present embodiment. In this case, an optical component (that is, the mirror 37A) for controlling the traveling direction of the probe beam 26A2 is required.

[Light Detection System]

As illustrated in FIG. 5, the light detection unit 6 detects the probe beams 26A2R and 26B2R that have passed through the alkali metal vapor. The light detection unit 6 outputs a signal according to the polarization angle (rotation of the linear polarization plane). The optically pumped magnetic sensor 1 obtains information on the magnetic field of the measurement object by using a signal corresponding to the polarization angle. The light detection unit 6 detects the probe beams 26Aa and 26Ba reflected by the polarization beam splitter 7. The light detection unit 6 outputs a signal according to the light intensities (light amounts) of the probe beams 26Aa and 26Ba.

The light detection unit 6 includes four photodiodes 38A, 39A, 38B, and 39B. The photodiodes 38A, 39A, 38B, and 39B output signals corresponding to the light intensities of the received lights, respectively. The photodiode 38A (third probe beam detection unit) detects the probe beam 26Aa. The photodiode 39A (signal light detection unit) detects the probe beam 26A3. The photodiode 38B (third probe beam detection unit) detects the probe beam 26Ba. The photodiode 39B (split signal light detection unit) detects the probe beam 26B3. The photodiodes 38A and 38B are disposed on the light output surface 7d. The photodiodes 39A and 39B are disposed on the light output surface 7c.

The photodiodes 38A and 38B detect the probe beams 26Aa and 26Ba. The photodiodes 38A and 38B output signals according to the probe beams 26Aa and 26Ba. The probe beams 26Aa and 26Ba depend on the characteristics of the probe beams 26A1 and 26B1 before being supplied to the alkali metal vapor. Specifically, the probe beams 26Aa and 26Ba are light components of longitudinally polarized light contained in the probe beams 26A and 26B. That is, according to the outputs of the photodiodes 38A and 38B, it is possible to monitor, for example, the fluctuation, and the like in intensities of the probe beams 26A1 and 26B1 due to changes in polarization components constituting the probe beam 26 caused by disturbance. The fluctuation in intensities of the probe beams 26A1 and 26B1 can be electrically canceled by subtracting the outputs of the photodiodes 38A and 38B from the outputs of the photodiodes 39A and 39B.

The change in the light amount of the probe beams 26Aa and 26Ba is also synchronized with the change in the light amount of the probe beam 26. That is, by detecting the change in the light amount of the probe beams 26Aa and 26Ba, the change in the light amount of the light source 27 can also be monitored. Therefore, the photodiodes 38A and 38B can be used as an output monitor for the light source 27. In addition, the outputs of the photodiodes 38A and 38B are proportional to the change in the light intensity of the probe beam 26 emitted from the light source 27. On the other hand, with respect to the change in the polarization angle of the probe beam 26 emitted from the light source 27, the polarity (positive or negative polarity) of the outputs of the photodiodes 38A and 38B is changed according to the direction (positive or negative direction) of the change. As a result, when the outputs of the photodiodes 38A and 38B are changed, it is difficult to split the light into components due to the change in the light intensity and components due to the change in the polarization angle. Therefore, the polarizing plate 41 is adopted. The polarizing plate 41 converts the change in the polarization angle of the probe beam 26 into the change in the light intensities of the probe beams 26Aa and 26Ba. Then, the change in the light intensity of the probe beam 26 and the change in the polarization angle can be evaluated as the change in the light intensities of the probe beams 26Aa and 26Ba. Therefore, the change of the probe beam 26 can be detected more easily. As a result, a stable output can be obtained. Furthermore, the present invention can also be used for evaluation using signal differences.

The photodiodes 39A and 39B detect the probe beams 26A3 and 26B3. The photodiodes 39A and 39B output signals according to the probe beams 26A3 and 26B3. The probe beams 26A3 and 26B3 are light components of longitudinally polarized light contained in the probe beams 26A2R and 26B2R after having passed through the alkali metal vapor. If there is no change in the magnetic field in the measurement object, the probe beams 26A2R and 26B2R are only the light components of transversely polarized light. The probe beams 26A2R and 26B2R do not contain the light components of longitudinally polarized light. Therefore, according to the outputs of the photodiodes 39A and 39B, it is possible to monitor the light intensities of the probe beams 26A3 and 26B3 reflecting the changes of the magnetic field in the measurement object. Specifically, the probe beams 26A1 and 26B1 supplied to the cell 2 are transversely polarized light. According to the state of the alkali metal vapor, the polarization angles of the probe beams 26A1 and 26B1 are changed. That is, the probe beams 26A2 and 26B2 after having passed through the alkali metal vapor contain light components of longitudinally polarized light. As a result, if the probe beams 26A2 and 26B2 including the longitudinally polarized light components return to the polarization beam splitter 7, the longitudinally polarized light components are reflected. The light components of the reflected longitudinally polarized light become the probe beams 26A3 and 26B3. The photodiodes 39A and 39B detect the probe beams 26A3 and 26B3. In short, in a case where there is no change in the state of polarization, the outputs of the photodiodes 39A and 39B become zero. In a case where a change occurs in the state of polarization, the photodiodes 39A and 39B output predetermined signals.

[Function and Effect]

Figure 9:
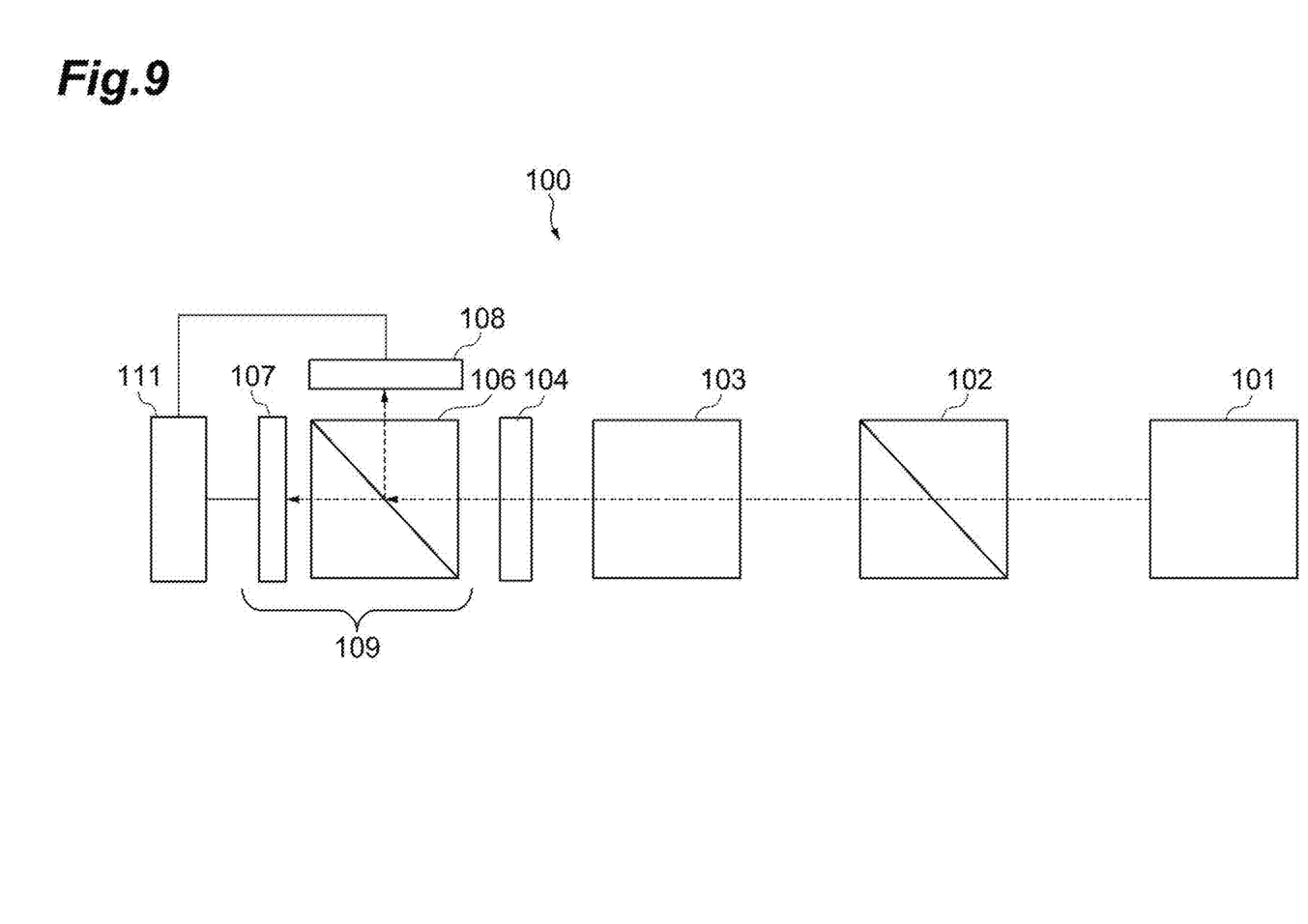
FIG. 9 is a view illustrating a configuration of an optically pumped magnetic sensor according to Comparative Example.

Hereinafter, a configuration of the optically pumped magnetic sensor 100 according to Comparative Example and functions and effects thereof will be described. After that, the functions and effects of the optically pumped magnetic sensor 1 will be described.

[Comparative Example]

FIG. 9 is a schematic view illustrating a configuration of a optically pumped magnetic sensor 100 according to Comparative Example. The optically pumped magnetic sensor 100 according to Comparative Example includes a light source 101, a prism 102, a cell 103, a wave plate 104, a polarization beam splitter 106, and photodiodes 107 and 108. The polarization beam splitter 106 and the photodiodes 107 and 108 constitute a polarimeter-type detector 109. The wave plate 104 is a so-called λ/2 type wave plate. According to the configuration, if light having a polarization angle of 45 degrees is input to the polarization beam splitter 106, a half of the light is input to the photodiode 107. The other half of the light is input to the photodiode 108. The processing device 111 obtains the difference between the outputs of the photodiodes 107 and 108. If the polarization angle is changed due to the magneto-optical rotation by the magnetic field, the outputs of the photodiodes 107 and 108 become biased. The bias of the outputs can be obtained by the difference between the outputs of the photodiodes 107 and 108.

The polarization angle of the light incident on the polarimeter-type detector 109 is 45 degrees. The light having a polarization angle of 45 degrees is obtained by the wave plate 104. The wave plate 104 shifts the polarization angle of the incident light. Therefore, when the polarization angle of the incident light fluctuates, the polarization angle of the output light also fluctuates.

For example, when the measurement object is a magnetic field of about femto Tesla, the rotation angle of the polarization angle to be detected is about micro radians. The approximation of $\sin(2\theta) \approx 2\theta$ is used to calculate the magneto-optical rotation angle $\theta$. However, if large fluctuation in the polarization angle of light occurs due to the disturbance, the above-described approximation is not satisfied. In other words, the polarization angle of the light deviates from the linear range. Therefore, it is necessary to adjust the rotation angle of the wave plate 104 with respect to the polarization angle of the input light so that the polarization angle of the light does not deviate from the linear range. In addition, when the state of polarization is changed due to the disturbance, the polarimeter-type detector 109 cannot determine whether the change in the state of polarization is caused by the magneto-optical rotation or the change in the state of polarization is caused by the disturbance.

In short, the optically pumped magnetic sensor 100 according to Comparative Example detects a change in polarization angle of linearly polarized light by using Faraday rotation due to a change in spin polarization. Therefore, the optically pumped magnetic sensor 100 according to Comparative Example includes the wave plate 104 that generates linearly polarized light and the polarimeter-type detector 109 that detects a change in polarization. However, in an actual magnetic field measurement environment, the direction of linear polarized light may fluctuate due to the effects of disturbances. Since the fluctuation of linear polarized light causes a deviation from the detection dynamic range, there is a problem in that the magnetic field measurement cannot be performed.

The polarization beam splitter 7 of the optically pumped magnetic sensor 1 according to the embodiment transmits the probe beams 26A and 26B emitted from the light source 27. As a result, probe beams 26A1 and 26B1 having a predetermined polarization angle are obtained. Then, the polarization beam splitter 7 provides the probe beams 26A1 and 26B1 to the cell 2. As a result, the alkali metal atoms in the interior of the cell 2 are irradiated with the probe beams 26A1 and 26B1 having a stable polarization angle. Then, according to the probe beams 26A1 and 26B1 having a stable polarization angle, it is possible to stably obtain the state of the alkali metal vapor enclosed in the cell 2 and brought into a predetermined excitation state by the pump beams 17A and 17B. In addition, the light amounts of the probe beams 26Aa and 26Ba are detected by the photodiodes 38A and 38B. As a result, it is also possible to detect a change in the light amount of the probe beam 26 (light source 27). More specifically, the change in the light intensities of the probe beams 26A1 and 26B1 is caused from the change in the light intensity of the probe beam 26 supplied from the light source 27 and the change of the polarization caused by the disturbance. Then, the change in the light intensities of the probe beams 26A1 and 26B1 can be monitored by the photodiodes 38A and 38B. Therefore, according to the optically pumped magnetic sensor 1, a stable output can be obtained.

The optically pumped magnetic sensor 1 does not require the wave plate 104 provided in the optically pumped magnetic sensor 100 according to Comparative Example. As a result, the optically pumped magnetic sensor 1 does not need to control the wave plate 104.

The optically pumped magnetic sensor 1 further includes mirrors 37A and 3711 that reflect the probe beams 26A1 and 26B1. The polarization beam splitter 7 functions as an incident optical system that generates probe beams 26A1 and 26B1 having a predetermined polarization angle. Furthermore, the polarization beam splitter 7 functions as a detection optical system that generates an output according to the change in the polarization angle of the probe beams 26A2R and 26B2R. Therefore, the configuration of the optically pumped magnetic sensor 1 can be simplified. The probe beams 26A2 and 26B2 are reflected by the mirrors 37A and 37B. As a result, the probe beams 26A1 and 26B1 pass through the alkali metal vapor twice as the probe beams 26A2 and 26A2R and the probe beams 26B2 and 26B2R. That is, the optical path length related to the measurement of magnetic field is doubled. As a result, the sensitivity of the magnetic field measurement is further improved.

The above-mentioned optically pumped magnetic sensor 1 further includes light waveguide units 29A and 29B which form light paths for the probe beams 26A1 and 26B1. The waveguides 34A and 34B of the light waveguide units 29A and 29B have light input surfaces 34Aa and 34Ba optically connected to the light output surface 7b of the polarization beam splitter 7. The prism mirrors 36A and 36B of the light waveguide units 29A and 29B have light output surfaces 36Ab and 36Bb optically connected to the cell side surfaces 2b, 2c. According to the light waveguide units 29A and 29B, a stable optical path is formed. As a result, the fluctuation and the scattering of the probe beams 26A1 and 26B1 caused by air can be suppressed. Furthermore, according to the light waveguide units 29A and 29B, it is possible to reduce the loss of light transmission that may occur between optical components. Therefore, it is possible to eliminate the influence of the fluctuation of the air on light. Furthermore, the optical assembly operation of the optically pumped magnetic sensor 1 can be facilitated.

The cell 2 of the optically pumped magnetic sensor 1 further has a cell side surface 2a on which the pump beams 17A and 17B are incident. The traveling directions of the pump beams 17A and 17B incident from the cell side surface 2a intersect the traveling directions of the probe beams 26A1 and 26B1 incident from the cell side surfaces 2c and 2d. According to the configuration, the optically pumped magnetic sensor 1 can be easily miniaturized.

The optically pumped magnetic sensor 1 further includes a beam splitting unit 28 which is disposed between the light source 27 and the polarization beam splitter 7 and forms the probe beams 26A and 26B split from the probe beam 26 and a light detection unit 6 which detects the probe beams 26A3 and 26B3 which are light components constituting the signal light obtained by passing through the alkali metal vapor. According to the configuration, it is possible to measure the magnetic field in a region far from the measurement object. As a result, external noise can be detected. Therefore, a so-called gradiometer-type sensor can be configured with one polarization beam splitter 7.

Specifically, the optically pumped magnetic sensor 1 acquires a magnetic field signal in the measurement object by the photodiode 39A. The optically pumped magnetic sensor 1 obtains a magnetic field signal caused by the environment by the photodiode 39B. Then, the difference of each output is obtained. By utilizing the difference, it is possible to cancel the noise component caused by the environmental magnetic field.

Heretofore, although the present invention is described, various forms may be implemented without being limited to the configuration of the present invention.

[Modified Example 1]

Figure 7A:
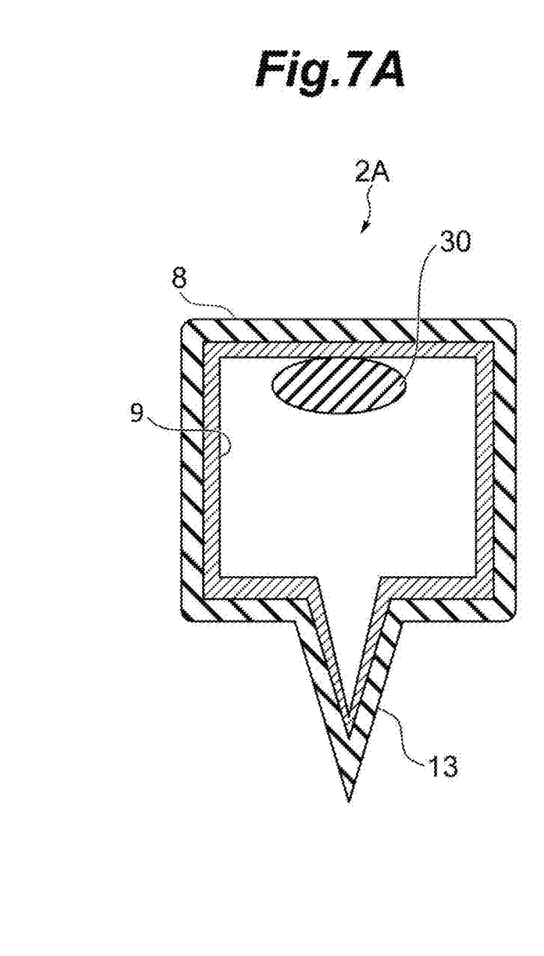
FIG. 7A is a view illustrating a cross-sectional configuration of a cell provided in the optically pumped magnetic sensor according to the embodiment.
Figure 7B:
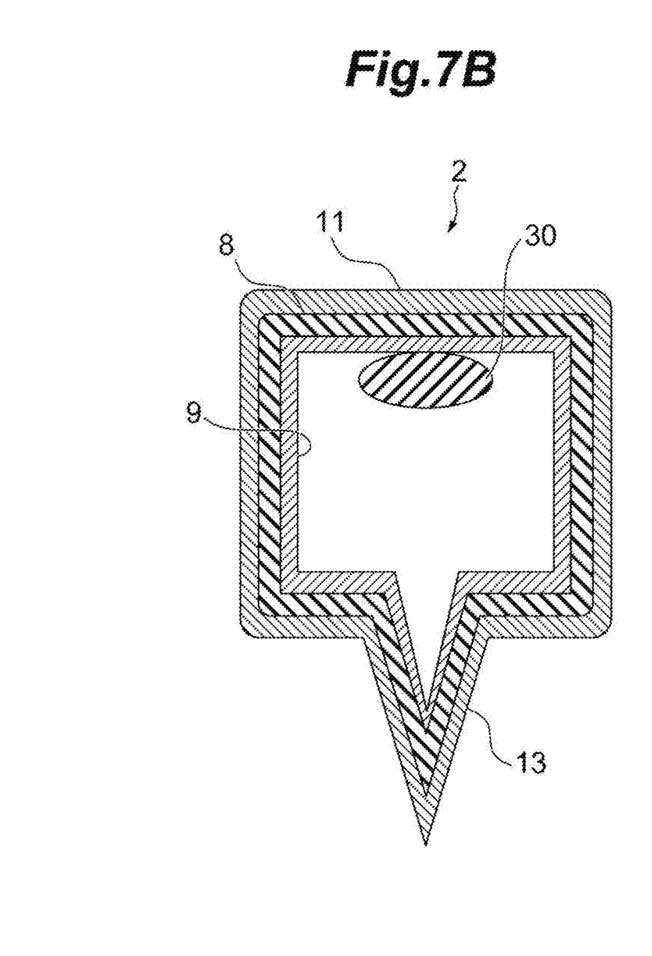
FIG. 7B is a view illustrating a cross-sectional configuration of a cell provided in the optically pumped magnetic sensor according to Modified Example 5.

As illustrated in FIG. 7B, the cell 2 according to the embodiment in which the alkali metal 30 is sealed includes the coating layer 9 provided on the inner surface of the glass substrate 8 and the coating layer 11 provided on the outer surface. For example, as illustrated in FIG. 7A, the cell 2A may have only the coating layer 9 provided on the inner surface of the glass substrate 8.

[Modified Example 2]

The cell 2 is, for example, entirely made of glass. Therefore, the cell 2 does not disturb the transmission of the pump beam and the probe beam throughout. For example, a cell made of a material that transmits light may have a window portion provided in a region through which the pump beam and the probe beam are transmitted and a light shielding portion provided in the other region. On the other hand, the cell made of a light shielding material which does not transmit light may have a window portion made of a material having optical transparency such as glass. The window portion is provided only in the area on which the pump beam and the probe beam are incident. According to the configuration, the incident paths of the pump beam and the probe beam can be limited. In addition, according to the configuration, it is possible to select a material capable of suppressing the infiltration of the alkali metal atoms into the cell and the permeation of the enclosing gas from the cell as the light shielding portion and the light shielding member. Therefore, the inner coating film and the outer coating film may be provided only to the window portion. That is, the coating layers 9 and 11 may be formed in at least a region which transmits the pump beam and the probe beam.

REFERENCE SIGNS LIST

1: optically pumped magnetic sensor, 2: cell, 2a: cell side (first cell light connection portion), 2b, 2d: cell side, 2c: cell side (second cell light connection portion), 3: pump beam source, 4: probe beam source, 6: light detection unit, 7: polarization beam splitter, 7a: light input surface (first splitter light connection portion), 7b: light output surface (second splitter light connection portion), 7c, 7d: light output surface, 8: glass substrate (container unit), 9: coating layer (inner coating film), 11: coating layer (outer coating film), 12: glass main body portion, 12A: magnetic incident portion, 13: sealing-off portion, 13A: sealing portion, 14: heater, 16A, 16B: measurement area, 17, 17A, 17B: pump beam, 18: light source (first light source), 19: light waveguide unit, 21, 22: waveguide, 23, 24: prism mirror, 21a, 22a, 23a, 24a: light input surface, 21b, 22b, 23b, 23c: light output surface, 26: probe beam (first probe beam), 26A, 260: probe beam, 26B: probe beam (split probe beam), 26A1, 26B1: probe beam (second probe beam), 26Aa, 26Ba: probe beam (third probe beam), 26A2, 26A3, 26B2, 26B3: probe beam (signal light), 26A2R, 26B2R: probe beam (reflected signal light), 27: light source (second light source), 28: beam splitting unit, 29A, 29B: light waveguide unit (optical member), 30: alkali metal, 31, 32, 36A, 36B: prism mirror, 31*a*, 32*a*: light input surface, 31*b*, 31*c*: light output surface, 34A, 34B: waveguide, 37A, 37B: mirror (mirror unit), 34A*a*: light input surface (first end surface), 34A*b*: light output surface (second end surface), 36A*a*, 34B*a*, 36B*a*: light input surface, 36A*b*, 34B*b*, 36B*b*: light output surface, 38A, 39A, 38B: photodiode, 39B: photodiode (split signal light detection unit), 41: polarizing plate, 100: optically pumped magnetic sensor, 101: light source, 102: prism, 103: cell, 104: wave plate, 106: polarization beam splitter, 107, 108: photodiode, 109: polarimeter-type detector, 111: processing device.

What is claimed is:

1. A cell for a optically pumped magnetic sensor which measures magnetic field by setting alkali metal atoms to a predetermined excitation state by a pump beam and detecting the excitation state by a probe beam, the cell comprising:
    a container unit sealing the alkali metal atoms and an enclosing gas and transmitting the pump beam and the probe beam; and
    an inner coating film provided on an inner surface of the container unit,
    wherein the inner coating film is made of an inorganic material.

2. The cell for the optically pumped magnetic sensor according to claim 1, further comprising an outer coating film provided on an outer surface of the container unit.

3. The cell for the optically pumped magnetic sensor according to claim 1, wherein the container unit includes:
    a main body portion transmitting the pump beam and the probe beam; and
    a sealing-off portion having a diameter smaller than that of the main body portion.

4. The cell for the optically pumped magnetic sensor according to claim 3, wherein the sealing-off portion is provided so that a base end side of the sealing-off portion is connected to the main body portion and a distal end side of the sealing-off portion protrudes from the main body portion.

* * * * *